United States Patent
Czeremuszkin et al.

(10) Patent No.: US 7,074,501 B2
(45) Date of Patent: Jul. 11, 2006

(54) COATINGS WITH LOW PERMEATION OF GASES AND VAPORS

(75) Inventors: Grzegorz Czeremuszkin, Pierrefonds (CA); Mohamed Latreche, Dollard-des-Ormeaux (CA); Michael Robert Wertheimer, Westmount (CA)

(73) Assignee: Nova-Plasma Inc. (CA)

( * ) Notice: Subject to any disclaimer, the term of this patent is extended or adjusted under 35 U.S.C. 154(b) by 0 days.

(21) Appl. No.: 10/487,181

(22) PCT Filed: Aug. 20, 2002

(86) PCT No.: PCT/CA02/02188

§ 371 (c)(1),
(2), (4) Date: Feb. 18, 2004

(87) PCT Pub. No.: WO03/016589

PCT Pub. Date: Feb. 27, 2003

(65) Prior Publication Data

US 2004/0195960 A1    Oct. 7, 2004

Related U.S. Application Data

(60) Provisional application No. 60/313,025, filed on Aug. 20, 2001.

(51) Int. Cl.
*H01J 1/62*     (2006.01)
*B05D 5/12*     (2006.01)
*H05B 33/00*    (2006.01)

(52) U.S. Cl. .................. 428/690; 428/917; 313/504; 313/512; 427/69

(58) Field of Classification Search ............... 313/504, 313/512; 427/69; 428/690, 917
See application file for complete search history.

(56) References Cited

U.S. PATENT DOCUMENTS

| | | | |
|---|---|---|---|
| 3,442,686 A | 5/1969 | Jones | |
| 5,736,207 A | 4/1998 | Walther et al. | |
| 6,146,225 A | 11/2000 | Sheats et al. | |
| 6,268,695 B1 | 7/2001 | Affinito | |
| 6,570,325 B1 * | 5/2003 | Graff et al. ............ | 313/506 |

FOREIGN PATENT DOCUMENTS

| | | |
|---|---|---|
| EP | 0 154 428 | 2/1985 |
| EP | 1 036 813 | 9/2000 |
| EP | 1 074 588 | 2/2001 |

* cited by examiner

*Primary Examiner*—Dawn Garrett
(74) *Attorney, Agent, or Firm*—Bachman & LaPointe, P.C.

(57) ABSTRACT

A multilayer structure has barrier properties for gases and vapors, for example oxygen and water vapor; the structure comprises: an organic substrate layer, and a multilayer permeation barrier thereon; the barrier comprises: a) a first inorganic coating contacting a surface of the substrate layer, and b) a first organic coating contacting a surface of the inorganic coating; the structure may be employed in a variety of articles where barrier properties are important especially in electronic articles such as organic light emitting diode devices where superior barrier characteristics over the life of the device are required.

23 Claims, 6 Drawing Sheets

COATINGS WITH LOW PERMEATION OF GASES AND VAPORS

CROSS REFERENCE TO RELATED APPLICATION

This application claims priority from U.S. Provisional Patent Application No. 60/313,025 filed Aug. 20, 2001, and the benefit of 35 USC 119(e); and is a National Entry from PCT/CA02/01288 filed Aug. 20, 2002 and claims the benefit under 35 USC 365(c) of such application which designated the USA.

TECHNICAL FIELD

The invention relates to structures impermeable to water vapor and oxygen; and devices containing them, as well as methods for manufacture of such structures and devices.

BACKGROUND ART

Barrier coatings may decrease permeation of gases and vapors through polymeric materials by several orders of magnitude. Such coatings are used to produce materials that may replace glass in food and pharmaceutical packaging, and in electronic applications. They are also used as protective coatings against attack by aggressive liquids, gases or vapors. One particularly important and demanding application is related to light emitting or photovoltaic devices based on organic semiconductors.

An organic light emitting diode (OLED) device is an emissive display in which a transparent substrate is coated with a transparent conducting material, for example, indium-tin oxide (ITO) which forms a hole-injecting electrode as the lowest layer of a light emitting diode. The remaining layers of the diode, commencing with the layer adjacent the ITO layer, comprise a hole-transporting layer (HTL), an electron-transporting layer (ETL) and an electron-injecting electrode.

The hole-transporting layer is essentially a p-type semiconductor and the electron-transporting layer is essentially an n-type semi-conductor. These are organic layers and in particular are conjugated organics or conjugated polymers; the latter are poor conductors without dopants but are doped to conduct holes (p-type) or electrons (n-type).

The electron-injecting electrode is typically a metal such as calcium, lithium or magnesium.

When a voltage is applied to the diode, electrons flow towards the hole-transporting layer and holes flow towards the electron-transporting layer. This produces electron-hole recombinations which release energy as light. Collectively the hole-transporting layer (HTL) and the electron-transporting layer (ELT) form the electroluminescent layer (EL) of the diode.

Such OLEDs provide a new generation of active organic displays of high efficiency, and most important of low cost. In those displays, high-quality images are created by a matrix of the light emitting diodes encapsulated in transparent materials.

The diodes are patterned to form a pixel matrix, where a single-pixel junction or EL emits light of a given color. All organic displays, designed so far, contain oxygen- and moisture-sensitive components, namely organic semiconductors and electron-injecting metals.

Consequently, the diodes require protection by means of an impermeable layer forming a barrier to oxygen and water vapor, which impermeable layer envelops the layers of the diode, and a support for the enveloped diode, preferably of high transparency, and which is impermeable, providing a barrier to oxygen and water vapor.

Thus far glass plate has been the support of choice, since it has excellent barrier and transparency properties. On the other hand, glass plate has the drawbacks of brittleness, high-weight, and rigidity.

A strong demand exists for plastic-film, both as the impermeable protective layer and as support material for the devices, since these may bring flexibility, high impact resistance, low weight, and, most of all, may enable roll-to-roll processing, as opposed to batch processing which has been used thus far. Such plastic film should, of course, be essentially impermeable, displaying low oxygen and water vapor transmission rates.

Although one may expect some further improvement in oxygen and moisture resistance of organic semiconductors employed in the diodes, extremely water-sensitive electron-injecting metals such as Ca, Li and Mg seem to be irreplaceable until a major breakthrough is made in solid state physics or in display design, both rather unlikely in the predictable future.

Other properties, which the envelope materials for organic displays should present, such as thermal resistance, low roughness, and low costs, are listed in [J. K. Mahon et al., Society of Vacuum Coaters, Proceedings of the $42^{nd}$ Annual Technical Conference, Boston 1999, p. 496]. Organic photovoltaic devices also require similar, flexible, barrier materials, so do liquid crystal flexible displays, where barrier requirements are, however, less demanding.

Organic displays are proposed for such equipment as high-resolution computer displays, television screens, cell-phones and advanced telecommunication devices, etc., which require µm-scale precision manufacturing, vacuum operations and lithography. In other words: technologies similar to those at present used in microelectronics. Other applications include large scale displays for advertising and entertainment, and various communication devices. These latter applications may require lower precision in manufacturing, processing in inert-dry atmospheres, roll-to-roll operations, inexpensive methods of patterning, for example, stamping or ink jet printing. In other words: low-cost technologies, perhaps similar to those at present used in special quality graphic-printing.

The problem is thus to develop flexible polymer films which are essentially barriers to oxygen and water vapor and which can be produced at low thickness sufficient for their envelope functions, and such that they can be readily employed in commercial manufacture of the organic devices, preferably in roll-to-roll processing.

In order to satisfy market requirements, a polymer film for an OLED would need to limit permeation of oxygen and water molecules to such extent that the lifetime of a typical device is at least 10,000 hours.

It is known in the flexible packaging art, to coat polymer films or sheets with thin inorganic coatings, for example, metal oxide coatings, to render the polymer films or sheets essentially impermeable to oxygen and water vapor. In practice it is impossible in commercial manufacture to produce such coatings without some pinholes or other defects which permit passage of oxygen and water molecules through the otherwise impermeable coating. This may not be a serious problem in the flexible packaging art where the packaging is typically protecting a food product of limited shelf life. However, the levels of permeability that may be acceptable in the short working life of flexible packaging in the food and other industries will certainly not meet the more exacting requirements for organic displays based on organic light emitting diodes, which must have a life of years rather than the days or weeks which represent the typical useful or working life of flexible packaging.

A typical, transparent barrier-coated material consists of a substrate, usually made of plastic, and a single, very thin layer of a barrier material usually made of metal oxide, a mixture (an alloy, or a compound) of at least two metal oxides, or amorphous or polycrystalline carbon. Usually, the barrier material, for example metal oxide, is very hard, for example 2–10 GPa, as described in U.S. Pat. No. 6,083,313. This, however, has a drawback of inevitable stresses in the coating, usually compressive stresses, intrinsic to the method of its deposition, for example Physical Vapor Deposition (PVD). U.S. Pat. No. 5,718,967 describes a coating consisting of organic and inorganic layers, where the first layer being in direct contact with the substrate is an organic layer, more especially an organosilicon. This organosilicon layer essentially functions as a primer, and is deposited in absence of oxygen and provides adhesion improvement between the substrate and an inorganic ($SiO_x$) coating.

U.S. Pat. No. 6,146,225 describes a multilayer structure consisting of organic coating, typically acrylic, deposited using PML technology (U.S. Pat. Nos. 5,260,095; 4,954,371; 4,842,893; 6,413,645) and an inorganic layer, typically an oxide or nitride, deposited using ECR-PECVD method. U.S. Pat. No. 5,725,909 describes depositing a multilayer structure composed of an acrylic primer and a barrier-providing material such as $SiO_2$, $Al_2O_3$ or a metal. U.S. Pat. No. 6,203,898 proposes depositing multilayer coatings, by plasma polymerization of condensable organic material, e.g., mineral oil or silicone oil, where a first layer comprises a carbon-rich material, and a second layer comprising silicon has no C—H or C—$H_2$ IR absorption peaks.

In all above US patents, the inorganic coatings are not in direct contact with the substrate material such as plastic film, but with an organic, organosilicone or organic containing layer that has been deposited thereon.

U.S. Pat. No. 4,702,963; and EP 062334 describe flexible polymer film having inorganic thin film deposited thereon, where the multilayer coating is composed of inorganic materials. The first inorganic material, adhesion improving layer, comprises a coating of an elemental metal, for example Cr, Ta, Ni, Mo or $SiO_2$ with >20% Cr; and the second, barrier-material, comprises a coating of a metal oxide, for example SiO, $SiO_2$, MgO, CaO or BaO. These coatings, however, are not entirely transparent, as required, for display applications, such as in an OLED.

The present invention describes multilayer coatings that are distinct from multilayer coatings described in the literature. According to the present invention, the inorganic barrier-providing coating is in direct contact with the substrate. Multilayer coatings presented in the literature have acrylic, organosilicon or organic layers deposited from mineral or silicone oil, organic precursors, etc., usually as smoothing, stress-release or adhesion-improvement layers. Those coatings, however, typically show a relatively high permeability to gases and vapors.

Plasma coatings, deposited from organic- and organosilicon precursors, typically exhibit high permeation of gases and vapors. In special conditions, where carbon or silicon carbide layers are deposited, the coatings show low transparency to visible light and to near-IR and near-UV radiation.

U.S. Pat. No. 6,083,313 describes coatings of essentially high hardness, 2–10 GPa, whereas barrier materials according to present invention typically have a hardness of less than 2 GPa. Other patents, such as U.S. Pat. No. 4,702,963 describe the coatings that have insufficient transparency for several important applications of the present invention, such as barrier coatings for flat panel displays, photovoltaic devices, and organic light-emitting sources.

DISCLOSURE OF THE INVENTION

The invention seeks to provide a multilayer structure which provides a permeation barrier to water vapor and oxygen for use in different devices.

The invention also seeks to provide a device such as an OLED device incorporating such a structure.

The invention also seeks to provide methods for producing the structure and the devices.

In accordance with one aspect of the invention there is provided a structure comprising:
  i) an organic substrate layer, and
  ii) a multilayer permeation barrier thereon, said barrier comprising:
    a) an inorganic coating contacting a surface of said substrate layer, and
    b) an organic coating contacting a surface of said inorganic coating.

In particular the inorganic coating is practically impermeable to gases, when formed as a continuous coating, and exhibits discontinuity-controlled permeability with the occurrence of inadvertent discontinuities in the inorganic coating; the organic coating exhibits diffusion-controlled permeation of water vapor and oxygen.

In another aspect of the invention, there is provided in an organic light emitting device in which light emitting diodes are encased in a barrier envelope comprising a structure of the invention, as described hereinbefore.

DETAILED DESCRIPTION OF INVENTION

In accordance with the invention, it has been found that barrier properties of an inorganic coating deposited onto a solid organic substrate depend substantially on the permeation properties of the substrate which is in direct contact with the inorganic coating. By way of illustration, for an extreme case scenario, a silica coating deposited directly onto a polyethylene terephthalate (PET) substrate having an oxygen permeability of about 200 $cm^3/m^2$ day, would provide much lower oxygen permeation than exactly the same silica coating deposited directly on a polydimethylsiloxane silicone rubber having an oxygen permeation of 60,000 $cm^3/m^2$ day.

The present invention provides a multilayer structure, in which an inorganic barrier-providing coating is in direct contact with an organic coating and an organic substrate, the organic coating having lower or at least the same permeation properties as those shown by the organic substrate.

The multilayer coatings are produced on organic, rigid or flexible substrates, for example on polymeric materials; the multilayer coatings significantly decrease permeation of gases and vapors through the substrates.

The multilayer coatings are, in a particular embodiment, transparent.

The multilayer coatings according to the invention consist of alternating layers of a hard inorganic material and of a relatively softer organic material, where the harder inorganic, permeation barrier-providing material essentially is the first layer in direct contact with the organic substrate.

The softer organic material coating provides not only stress-release properties, but also contributes to barrier properties and serves as a protective coating.

Multilayer inorganic/organic coatings according to the present invention may be deposited in a partial vacuum or at or above atmospheric pressure. The material and method according to the invention are particularly useful in manufacturing high-barrier packaging materials, light-emitting devices, medical devices, protective coatings, etc.

The multilayer coatings are produced on rigid or flexible organic substrates, for example polymeric materials, and significantly decrease permeation of gases and vapors through such substrates.

In specific preferred embodiments, the present invention relates to coatings consisting of successive layers of a harder inorganic, permeation barrier-providing material and of a softer, stress-release providing organic material, for example multilayer inorganic/organic coatings deposited in a partial vacuum or at atmospheric pressure.

THEORETICAL BACKGROUND

Permeation through inorganic barrier coatings deposited on organic substrates, for example plastic films, either by Physical Vapor Deposition (PVD) or Plasma Enhanced Chemical Vapor Deposition (PECVD) methods, is a discontinuity or defect-controlled phenomenon. More specifically, observed residual permeation through silica or silicon nitride coated films is due to the presence of micrometer and submicrometer size discontinuities or defects in those coatings. In accordance with the invention a model for gas permeation through defects in barrier coatings was developed, which is based on a very simple geometrical approach. The model allows evaluation of permeation through a single or through multiple circular defects in the coating, and also in special cases of size distributions and non-cylindrical symmetry. This simple model shows good agreement with the results of more complex computer simulations, and it has proven useful in the analysis of permeation data for barrier-coated plastic films.

According to such model, steady-state permeation Q through N defects (of radius $R_0$) in a plastic film of thickness L and surface area A may be expressed as:

$$Q = \frac{N}{A} \frac{2\pi D \phi_0}{} \left( R_0 + \frac{R_0^2}{L} \right)$$

where D is the diffusion coefficient of the permeant in the film, and $\Phi_0$ is its concentration in a subsurface zone of the film. In this equation, N/A corresponds to defect number density, $D\Phi_0$ is a characteristic of the film, and the last term describes defect geometry. Analogous equations were derived for defects of non circular symmetry and for defects characterized by size distribution.

The above equation clearly shows that permeation through coated films depends on the diffusion and sorption parameters of the substrate film.

Figure 9:
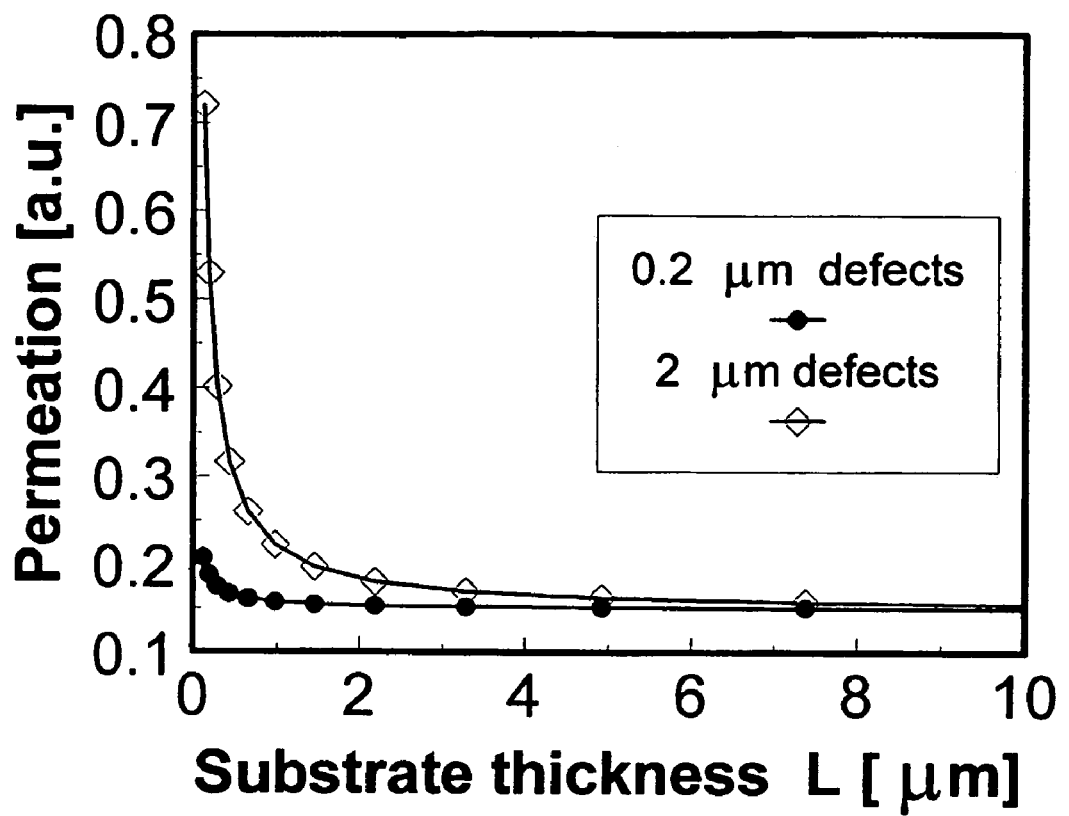
FIG. 9 illustrates graphically relationship between permeation changes and thickness of substrate film having a coating with pinhole discontinuities.

FIG. 9 shows permeation changes vs. the thickness of the substrate film for a coating containing 1 μm size defects (pinholes), according to equation (1). It can be seen that for very thin films, permeation strongly decreases with increasing substrate thickness, while for films comparable or thicker than average defect size, it is almost constant.

Important conclusions from the above considerations, which are relevant to the present invention, are the following:

although the size and number density of defects are significant factors affecting the barrier, permeation through the substrate material is also an important parameter that determines barrier performance, only a very thin subsurface zone of the substrate, comparable or thinner than the average defect size, determines the value of permeation.

The typical sizes of discontinuities or defects in transparent barrier coatings deposited by PVD or PECVD methods are close to 1 μm. To achieve good barrier properties, the substrate subsurface zone which has a thickness of about 1 μm, or the organic primer-layer which is generally thinner than about 1 μm, which are in direct contact with the coating, should have the lowest possible permeation. In practice they should exhibit permeation lower than the plastic film substrate itself.

The invention resides in a multi-layer barrier on an organic substrate, for example a plastic film, in which the inorganic layer of the multi-layer barrier contacts the organic substrate.

Permeation through plastic films and through organic coatings is controlled by diffusion, while permeation through inorganic coatings is controlled by the presence of micrometer and submicrometer size discontinuities or defects in these coatings such as pinholes, scratches and cracks. Thus diffusion in the bulk of inorganic coatings, for example in metal oxides, nitrides and silica, is practically nonexistent near room temperature. These discontinuities or defects are unwanted but inevitable, and result from dust particles, surface imperfections of plastic films, as well as from coating, web handling and converting processes.

FIGS. 1–4 show several configurations of a substrate plastic film, coated with a multi-layer barrier coating. This structure can be used for further depositing OLED- or other display components.

Figure 4:
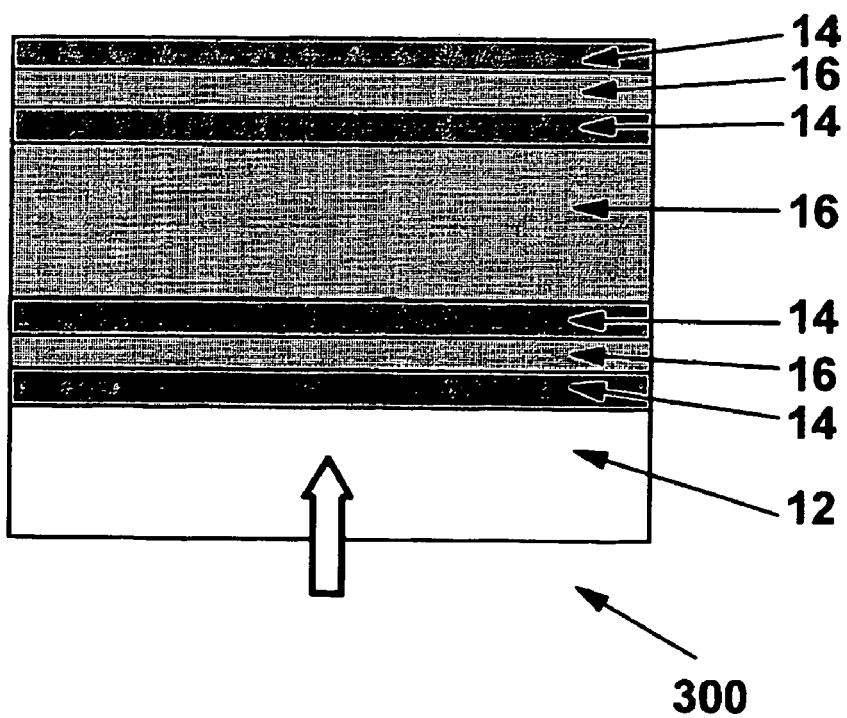
FIG. 4 illustrates schematically a structure of the invention in a fourth embodiment.

As shown in FIG. 4, looking along the permeation direction shown by the arrow, the permeant enters into the substrate plastic film 12 from the gas phase (e.g., ambient air) Then it diffuses through the substrate plastic film 12 and passes through discontinuities or defects (openings) in the first inorganic coating 14. Next, it diffuses through the first organic coating 16 and passes through openings in the second inorganic coating 14, then it diffuses through the second organic coating 16, and continues its passage through the multilayer barrier coating, in this way through the successive coatings.

In "defect controlled permeation", the highest resistance to permeation is due to diffusion in the nearest vicinity of the discontinuities or defects, where the local concentration gradients are highest. The thickness of this "nearest vicinity" layer depends on discontinuities or defect size, being typically less than a micrometer, and the mass transport in this region depends strongly on the diffusion coefficient of the material.

Diffusion coefficients of plastic substrate films such as PET are already quite low. Depositing an inorganic barrier coating directly on such films in accordance with the invention additionally decreases permeation by many orders of magnitude. However, coating them first with a more permeable organic coating, showing a higher diffusion coefficient, as is conventional in the art, diminishes barrier performance.

Some plastic films such as polycarbonate (PC) films show very high diffusion coefficients, others such as polynorbornene, (PNB) show a large difference between oxygen and water diffusion. However, for display purposes they are typically "hard-coated", which brings them to a permeation level similar to that of bare PET. This hard-coating, which is of an organic polymer, is part of the organic substrate, and contacts the inorganic coating.

The advantage of "inorganic first" over "organic first" has been shown experimentally by producing both types of samples, using the same substrate and measuring their oxygen transmission rates (MOCON test).

Figure 5:
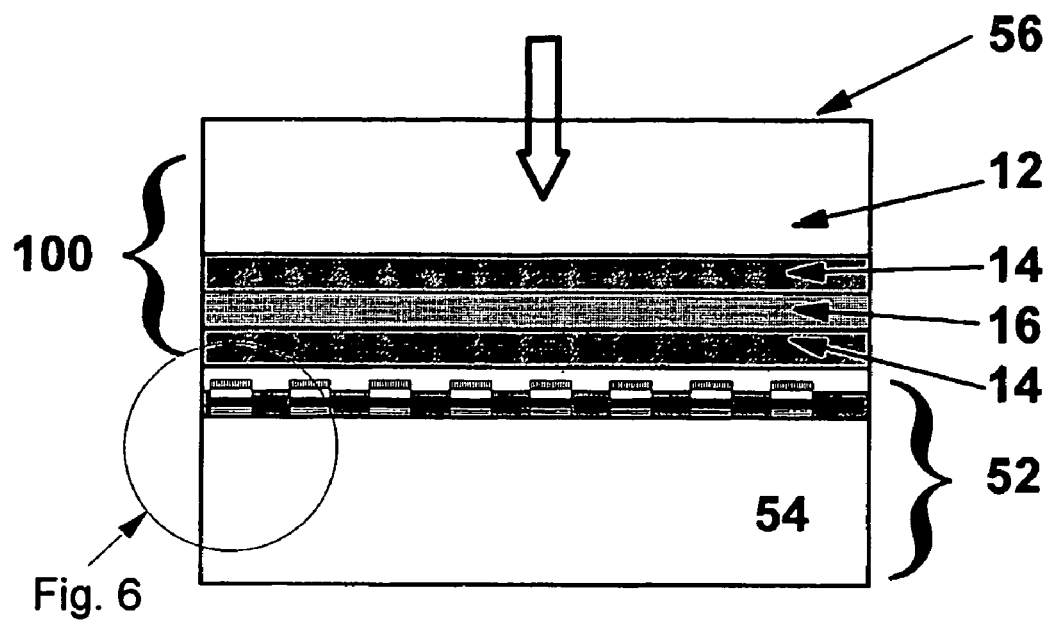
FIG. 5 illustrates schematically an OLED device incorporating a structure of the invention.
Figure 6:
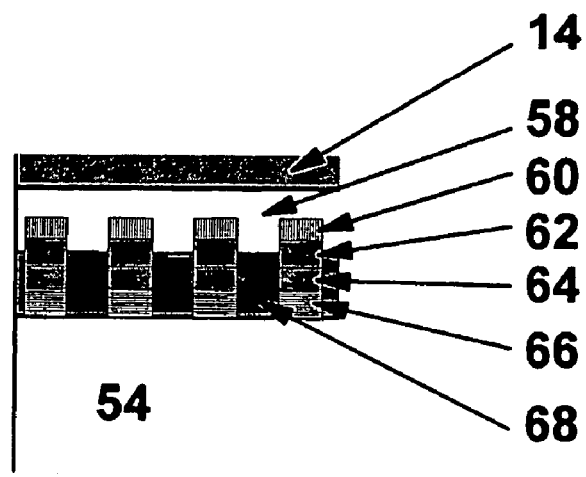
FIG. 6 illustrates schematically a detail of the OLED of FIG. 5.
Figure 7:
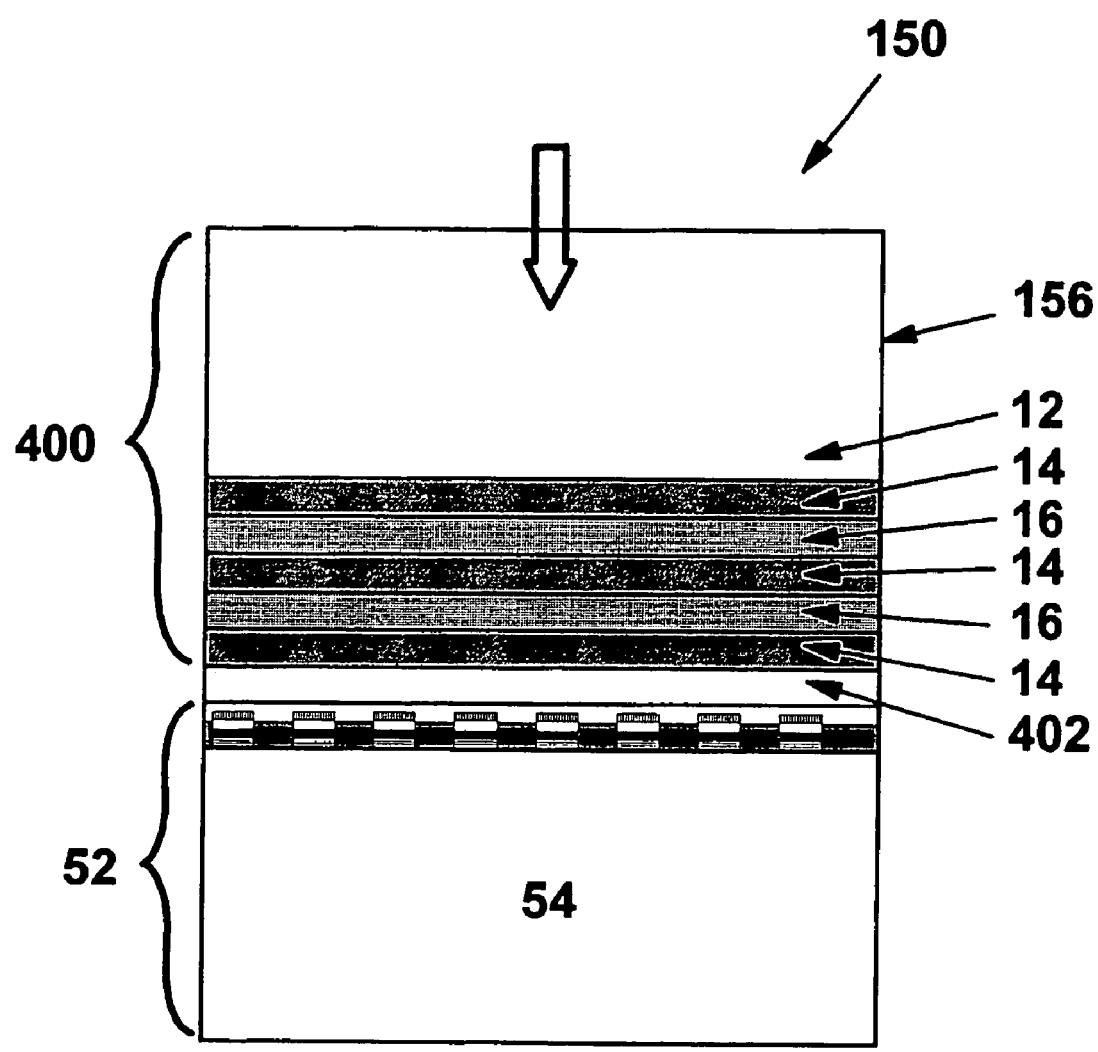
FIG. 7 illustrates schematically an OLED device incorporating a structure of the invention in another embodiment.

FIGS. 1–4 show barrier-coated plastic substrates, which may be used later for depositing OLEDs or other electronic devices. FIGS. 5 to 8 show configurations of multi-layer coatings for encapsulation of OLEDs (FIGS. 5 to 7) or other electronic devices (FIG. 8), that have been earlier deposited on an impermeable substrate (FIG. 6). FIGS. 5 to 7 refer to OLEDs produced on glass. In general, they may refer to other devices produced on other rigid or flexible substrates. Here, the inorganic coating 14 also contacts the plastic film, organic substrate 12, looking along the permeation direction. This plastic film may be the substrate from FIGS. 1–4, a whole structure placed upside down and fixed by an adhesive, or it may be a thick, multi-micrometer, top-coat protective layer of, for example, a curable resin of low diffusion coefficient.

FIG. 7 shows an OLED device deposited on the flexible barrier-substrate, previously produced according to the invention, and encapsulated using the same type of barrier-substrate, but placed upside down and glued using an adhesive.

The functions of the different layers are the following:

Substrate:
provides mechanical stability;
provides some resistance to permeation by virtue of limiting local diffusion.

Equivalent to substrate—an organic resin, in the case of encapsulation:
provides mechanical protection;
provides some resistance to permeation by virtue of limited local diffusion.

Thin inorganic coatings:
their presence changes the mechanism of permeation from "diffusion controlled" to "defect controlled";
provide very limited area accessible to permeation, namely, that due to the presence of defects;
provides a near perfect barrier elsewhere; an additional feature of PECVD inorganic coatings: presence of the "interphase", which provides a "smooth" region of transition between the inorganic coating and the substrate, which improves overall mechanical stability, including adhesion and stretchability.

Thin organic coatings:
provide a tortuous path of permeation, since diffusion takes place only near the location of defects; distribute the permeant over a wide area between inorganic coatings; release the mechanical stresses inevitably present in dense inorganic coatings; an additional feature of PECVD organic coatings: presence of the "interphase", which provides a "smooth" region of transition between the coating and the substrate.

in multi-layer coatings including different organic layers: one may act as a barrier against permeation of water, the other against oxygen. Thus, in the multilayer barrier in the structure of the invention, the inorganic coating changes the mechanism of gas and vapor permeation through the structure from "solubility-diffusion controlled" permeation to "defect controlled" permeation and it limits the surface area accessible to permeant. The inorganic coating itself, considered separately, does not have any significant barrier properties, which is due to the presence of inevitable discontinuities, such as pinholes.

In "defect controlled" permeation, it is the organic layer, for example the plastic film, organic substrate, that contacts the inorganic coating, which restrains the permeation. Almost all resistance to permeation is local and limited to the nearest vicinity of dicontinuities or defects. The organic coating does not have high-barrier properties, if considered separately, at thicknesses below 100 nm, and so consequently permeation across the whole coating, based on "solubility-diffusion" mechanism, would be high.

The organic coating, or coatings, in the structure of the invention has two roles to play: (I) to provide the resistance to permeation near the defects in the inorganic coating and (II) to distribute the permeant molecules that reach it over a large surface area. For role (I), a thinner organic layer is better (e.g., below 100 nm); for role (II), an organic layer thicker than the average defect size is better (e.g., greater than 1000 nm). It is especially preferred that a thick organic coating (thickness greater than 1000 nm), be an intermediate layer buried within the multilayer barrier, and that it not be in contact with the first inorganic layer which contacts the organic substrate.

Discontinuities or defects in the inorganic coatings are inevitable, but it is advantageous to limit their number density to improve barrier performance. For thin inorganic coatings, number density of defects decreases with increasing thickness. Thicker coatings are better, however, if they become too thick, for example above 350 nm, stresses start to play a role and barriers deteriorate due to stress induced cracking.

DETAILED DESCRIPTION OF PREFERRED EMBODIMENTS

The multilayer barrier is composed of alternating coatings of inorganic and organic material, the inorganic barrier-providing coating being in direct contact with the organic substrate.

a) Organic Substrate

The organic substrate is suitably a plastic film. More especially the organic substrate is preferably:
- a flexible or rigid material which is preferably mainly made of a polymeric material,
- a plastic material, a subsurface zone of which has been densified, crosslinked, or additionally cured by plasma, UV, VUV (vacuum ultraviolet), X-ray, gamma-ray, or ion bombardment treatment, or other equivalent method, thereby having locally, in terms of depth, decreased permeation of the permeant.
- plastic material having a coating which may be inorganic, organic or a composite thereof that has a permeability lower or at least the same, but essentially not higher, than the permeability of the substrate material itself.

Suitable organic substrates are plastic films of polyethylene terephthalene, polyethylene naphtalate, polynorbornene, polyether sulfone, polyarylates, polycarbonate and composites of them. The plastic film suitably has a thickness of 5 to 5000 μm, preferably 50 to 300 μm.

In accordance with the invention the substrate is to be understood as a self supporting film on which the multilayer barrier coatings are deposited; or as a cast film which is formed, as by casting, on the previously deposited coatings, for example where the multilayer coatings are successively deposited on a diode of an OLED.

The organic substrate should have a smooth, flat surface for direct contact with the first inorganic coating of the barrier, this surface should be free of deliberately or intentionally introduced irregulatities such as would result, for example, from ion etching, or other treatments of the substrate surface prior to deposition of the inorganic coating and which have the purpose of promoting adherence.

In general, suitable organic substrates may be: single, multi-layer or coextruded plastic films;
- plastic films having the surface modified by at least one of the following techniques:
  - corona discharge treatment,
  - low- or atmospheric pressure glow discharge,
  - flame treatment and heat treatment, and
  - a radiation treatment, wherein the radiation is UV, VUV, X-or gamma rays or ion bombardment;
- plastic films having a surface coated with a functional coating, for example, a hard-coating, an anti-scratch coating, an anti-abrasion coating, an anti-reflective coating, an anti-glare coating, a chemically-active coating, an oxygen scavenger coating, a desiccant coating, a UV-protective coating, or a colour-adjustment coating.

b) Multilayer Barrier Coatings

The multilayer barrier coatings suitably have an overall hardness below 2 GPa, and preferably about 1.7 GPa.

The inorganic barrier-providing coating material, which is preferably of at least partly ceramic character, may be deposited using a plasma assisted deposition method in a partial vacuum or at or at or above atmospheric pressure.

The organic coating material may be deposited preferably by a plasma assisted process in a partial vacuum or at atmospheric pressure, but also by gas phase polymerization or by evaporation, sputtering or other PVD method or by conventional coating from liquid or solid phase including, casting, extrusion, thermal transfer, spray-coating, dip-coating or spin-coating followed by curing.

The inorganic coating or coatings each suitably have a thickness of 1 nm to 1 μm, preferably 10 nm to 350 nm. In especially preferred embodiments the inorganic coating or coatings each have a thickness of greater than 40 nm and thus more than 40 nm up to 1 μm.

In an especially preferred embodiment the inorganic coatings each have a thickness of 10 nm to 350 nm, more preferably from 45 nm to 350 nm.

The organic coating or coatings each suitably have a thickness of from 5 nm to 10 μm, preferably from 20 nm to 500 nm, to provide both a tortuous path and distribution of the permeant.

It is especially advantageous to employ organic coatings having a thickness of less than 90 nm or greater than 1100 nm.

At a thickness of less than 90 nm, permeation along the tortuous path in the organic coating occurs according to a solubility-diffusion mechanism. Three parameters are important to decrease this permeation, namely:
- diffusion coefficient of the material in which diffusion takes place;
- distance between defects in the inorganic coatings, separated by the organic coating (the farther defects are apart the better)=the length of the tortuous diffusion path (the longer the better);
- cross-section of the material involved in diffusion (the smaller the better)=the thickness of the organic layer (the thinner the better).

At a thickness of greater than 1100 nm, spreading the small amount of the permeant, which reaches the interior of the barrier system, over a large surface area is beneficial from the point of view of device lifetime. For this purpose one of the organic coatings inside the multilayer barrier should preferably be thicker than the average defect size, namely, thicker than 1 μm. In other especially preferred embodiments the organic coatings each have a thickness of 20 nm to 500 nm, with at least one inner organic coating preferably having a thickness greater than 1 μm.

In another especially preferred embodiment the inorganic coatings each have a thickness of 10 nm to 350 nm and the organic coatings each have a thickness of 20 nm to 500 nm, with at least one inner organic coating preferably having a thickness greater than 1 μm.

Preferably, the multilayer barrier includes at least one thin inorganic coating, as described herein.

The performance of each coating of the structure of the invention may be identified separately:
inorganic coatings (hypothetically free-standing, therefore only calculated—based on the defect-controlled permeation):OTR>100 $cm^3/m^2$ day;
organic coatings: at least 100 $cm^3/m^2$ day;

Thus, although individual layers may have poor performance separately, together they form a structure that is relatively impermeable.

A typical embodiment of a structure of the invention is: substrate film (OTR>100 $cm^3/m^2$ day)+inorganic coating (OTR>100 $cm^3/m^2$ day)+organic coating (OTR>100 $cm^3/m^2$ day)=OTR<0.005 $cm^3/m^2$ day, which is the detection limit of standard ASTM methods for measuring permeation; (or passing the "calcium test" or equivalent test at predetermined conditions, for example 100 hrs at 85° C. and 50%

RH [ref: G. Nisato, et all. Proceedings of Information Display Workshop, IDW, October 2001]).

The inorganic coatings inevitably contain discontinuities or defects, and typically at least $10^3$–$10^5$ defects, having a size range of 1 micrometer or submicrometer size pinholes per m$^2$. The structures of the invention provide low permeation in spite of the presence of discontinuities or defects in the coatings.

The multilayer inorganic/organic barrier structure of the invention comprising a plastic film substrate and a multi-layer barrier containing at least one inorganic coating and at least one organic coating, and where multilayer inorganic/organic barrier system, deposited on the substrate, passes the "calcium test" for more than 100 hrs at 85° C. and 50% RH.

The multilayer permeation-barrier structures of the invention typically provide an oxygen permeation, measured by ASTM methods F1927 and D3985 which is lower than 2, preferably lower than 0.01 cm$^3$/m$^2$ day.

The structures act as a barrier against permeation of a gas, for example, air, oxygen, argon or carbon dioxide, or as a barrier against permeation of a vapor, for example vapors of: water, alcohols, hydrocarbons, and aromatic oils; or as a barrier against permeation of gas and vapor.

The structures may be employed in manufacturing high-barrier packaging materials, displays, photovoltaic devices, light-emitting devices, medical devices, protective coatings and the like.

c) Inorganic Coatings

Suitable inorganic coatings forming the harder material are completely or essentially made of an inorganic material selected from the group consisting of $SiO_2$, $SiO_x$, $SiO_xC_y$, $Si_3N_4$, $Si_xN_yC_z$, $SiO_xN_y$, $TiO_2$, $TiO_x$, $ZrO_2$, $ZrO_x$, $Al_2O_3$, $SnO_2$, $In_2O_3$, PbO, $PbO_2$, ITO, tantalum oxide, yttrium oxide, barium oxide, magnesium oxide, magnesium fluoride, calcium fluoride, calcium oxide, other metal oxides and halides, $P_2O_5$, $Be_2O_3$, and other non-metal oxides, amorphous carbon, sulphur, selenium, their mixtures, alloys or compounds; with x preferably representing an integer ranging from 1 to 3, y preferably representing a number ranging from 0.01 to 5 and z preferably representing a number ranging from 0.01 to 5.

b) Organic Coatings

Suitable softer materials for the organic coating comprise plasma-deposited coatings obtained from mixtures containing at least one organic substance, gas or vapor, with or without contribution of inert or reactive gases, the organic substance being preferably chosen from the following groups of chemicals: hydrocarbons, organic compounds containing one or more heteroatoms, alcohols, ethers, esters, or their combinations, organosilicon compounds, and organometallic compounds.

Suitable softer materials for the organic coating comprise plasma-deposited coatings obtained from mixtures containing at least one organic substance, gas or vapor, with or without contribution of inert or reactive gases, the organic substance being preferably chosen from the following groups of chemicals: hydrocarbons, organic compounds containing one or more heteroatoms, alcohols, ethers, esters, or their combinations, organosilicon compounds, and organometallic compounds.

Organic coating (refers to a single layer in a multi-layer structure):
  material: organic polymers, including parylenes, polyolefines, cyclopolyolefines, polyarylenes, polyacrylates, polycarbonates, polymers containing a heteroatom in the main chain or in side groups, organometallic polymers including polyorganosiloxanes of molecular weight higher than $3\times10^2$. Preferably, polymer coatings obtained in a plasma assisted process from mixtures containing at least one organic substance (gas or vapor) with or without contribution of inert or reactive gases; the organic substance is preferably chosen from the following groups of chemicals: aliphatic hydrocarbons, for example: ethylene, acetylene, methane and cyclobutane, aromatic hydrocarbons, for example: di-paraxylylenes, and styrene derivatives, organic compounds containing one or more heteroatoms, for example: alcohols, ethers, estersallylamine, aromatic amines, aliphatic chlorides fluorides and. sulphides or their combinations, organosilicon compounds, for example: organosilanes, such as tetramethylsilane,trimethylsilane, methyltrimethoxysilane and trimethylchlorosilane, organosiloxanes such as hexamethyldisiloxane and tetraethoxysilane, and organosilazanes, such as hexamethyldisilazane and organometallic compounds, for example thetraethylgermanium, tetraethyllead, and cyclopentadienyl iron. More preferably, plasma polymerized hexamethyldisiloxane and parylenes.

Particular organic coating materials are organic polymers, including parylenes, polyolefines, cyclopolyolefines, polyarylenes, polyacrylates, polycarbonates, polymers containing a heteroatom in a main chain or in side groups, organometallic polymers including polyorganosiloxanes of molecular weight higher than $3\times10^2$. Preferably, polymer coatings obtained in plasma assisted process from mixtures containing at least one organic substance (gas or vapor) with or without contribution of inert or reactive gases; the organic substance forming the organic coating is preferably chosen from the following groups of chemicals: ethylene, acetylene, and other aliphatic hydrocarbons, di-paraxylylenes and other aromatic hydrocarbons, organic compounds containing one or more heteroatoms, alcohols, ethers, esters, or their combinations, organosilicon compounds, and organometallic compounds. More preferably, plasma polymerized hexamethyldisiloxane and parylenes.

The number of layers in the multilayer barrier is significant, the minimum number of layers is two; permeation through more layers is generally lower, but the dependence is not linear and does not follow the rule for diffusion in multi-layer plastics; the first pair of layers provides a barrier improvement factor (BIF)~$10^3$, while the next identical pair may improve the barrier only to a lesser extent (additional BIF<<$10^3$).

Typically the maximum number of layers is 101, and preferably the number of layers is 5 to 11, including both inorganic and organic coatings. The number is also the result of compromise between the barrier properties and the cost.

DETAILED DESCRIPTION OF DRAWINGS

Figure 1:
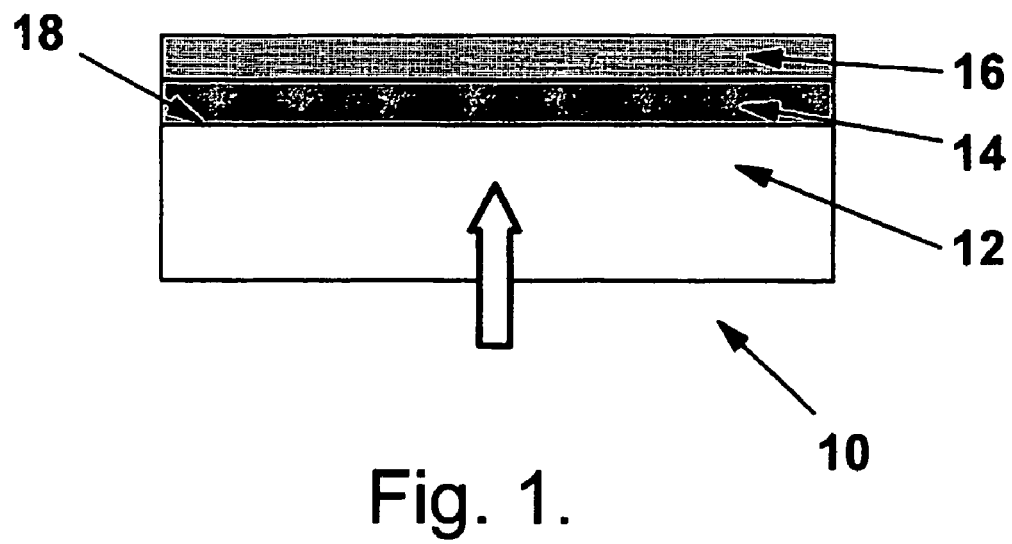
FIG. 1 illustrates schematically a structure of the invention in a first embodiment.

With further reference to FIG. 1, a multilayer barrier structure 10 comprises an organic film substrate 12 having an inorganic coating 14 and an organic coating 16; the arrow shows the permeation direction. Inorganic coating 14 is in direct contact with the surface 18 of substrate 12.

Figure 2:
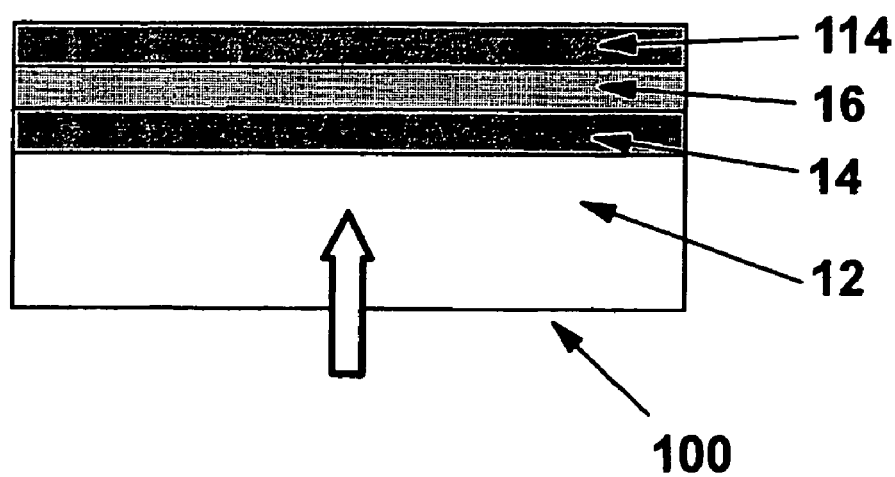
FIG. 2 illustrates schematically a structure of the invention in a second embodiment.

In FIG. 2, a multilayer barrier structure 100 comprises an organic film substrate 12, an inorganic coating 14 in direct contact with substrate 12, an organic coating 16 on coating 14 and a second inorganic coating 114 on coating 16; the arrow shows permeation direction.

Figure 3:
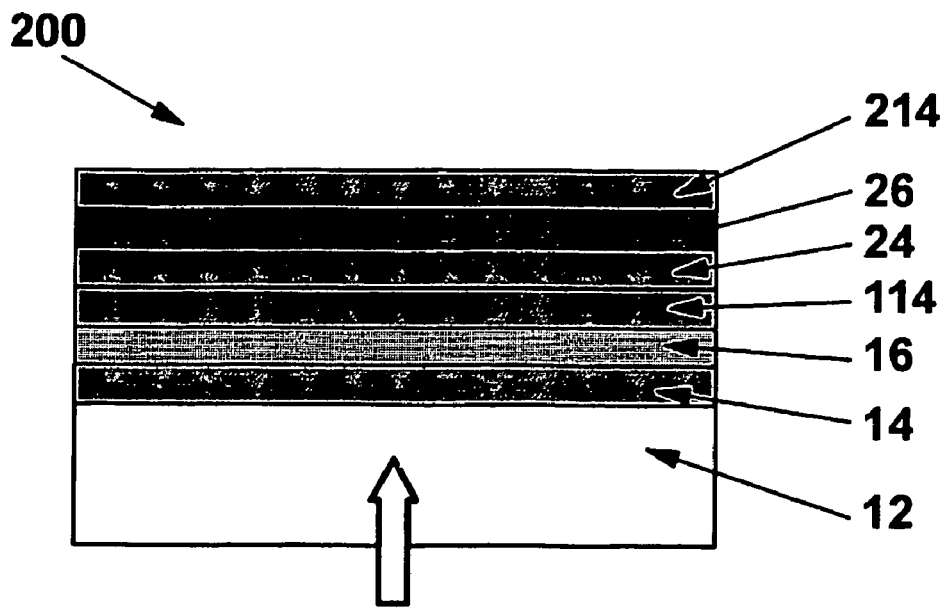
FIG. 3 illustrates schematically a structure of the invention in a third embodiment.

In FIG. 3, a multi-layer barrier structure 200 has several different inorganic and organic coating layers deposited in predetermined order; more especially a first inorganic coating 14 contacts the substrate 12, an organic coating 16 contacts inorganic coating 14, a second inorganic coating 114, of the same material as the first inorganic coating 14, contacts organic coating 16, a second type of inorganic coating 24 coats the second inorganic coating 114, a second type of organic coating 26 contacts inorganic coating 24 and a final inorganic coating 214, of the same type as coatings 14 and 114 contacts organic coating 26; the arrow shows permeation direction.

In FIG. 4, a multi-layer barrier structure 300 includes seven alternate layers of inorganic coatings 14 and organic coatings 16 on a plastic film substrate 12; the arrow shows permeation direction. The inorganic coatings are all of the same type as are the organic coatings 16.

In FIG. 5, an OLED assembly 50 has a multi-layer barrier structure 100 of FIG. 2 encapsulating an OLED 52 having a glass substrate 54. Structure 100 forms an encapsulating cover 56 over OLED 52; the arrow shows diffusion direction.

FIG. 6 is a schematic representation of the OLED 52 of FIG. 5 (magnified part of FIG. 5) having inorganic coating 14 of the structure 100, a protective layer 58, a low-work-function electrode layer 60, an electron-transporting organic layer 62, a hole-transporting organic layer 64, a transparent conductive electrode, e.g., indium tin oxide, ITO, 66 and schematically shown other components 68 of a typical active matrix display including thin film transistors (TFT); glass substrate may be modified, for example, passivated with an SiN coating.

FIG. 7 is a schematic representation of an OLED assembly 150 in another embodiment, having a multi-layer barrier structure 400 encapsulating an OLED 52 having a glass substrate 54. Structure 400 forms an encapsulating cover 156 over OLED 52; structure 400 has a plurality of inorganic coatings 14 and organic coatings 16 on plastic film 12. An adhesion providing layer 402, for example a curable adhesive resin bonds structure 400 to OLED 52; the arrow shows diffusion direction.

Figure 8:
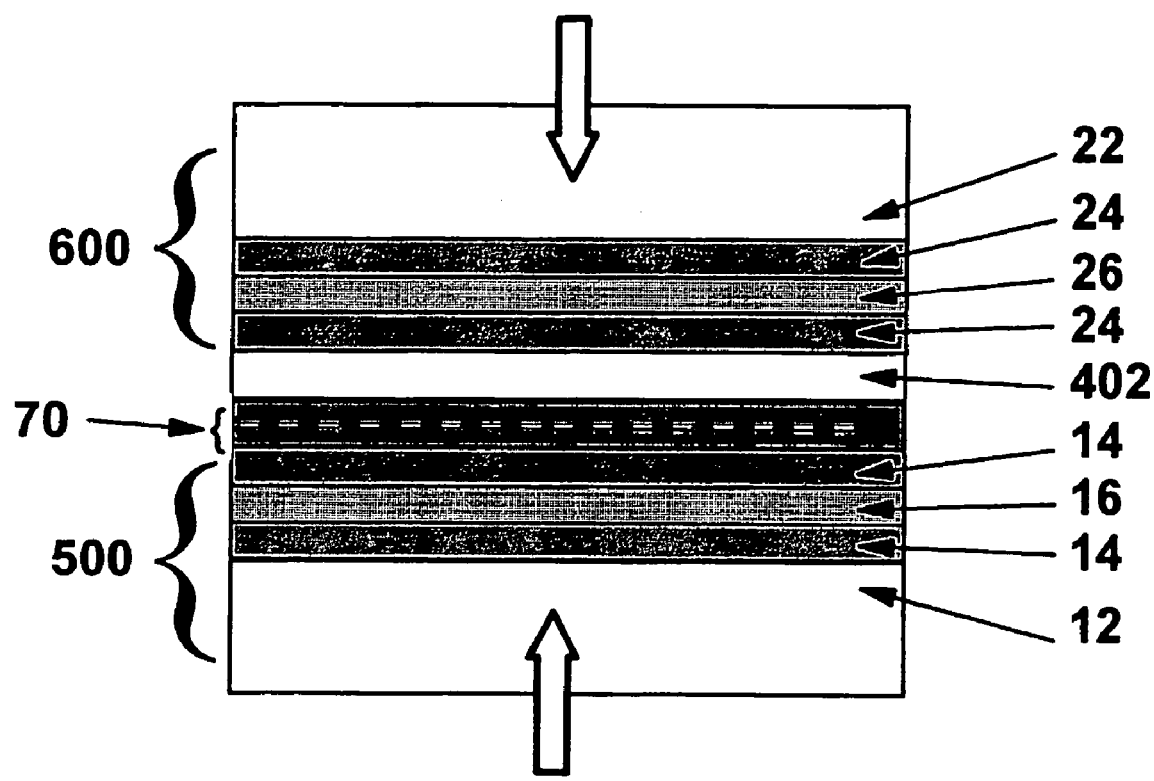
FIG. 8 illustrates schematically a flexible electronic device incorporated in a structure of the invention.

In FIG. 8, a pair of multi-layer barrier structures 500 and 600 encapsulate flexible electronic device 70. Structure 500 forms a bottom barrier which includes a multi-layer barrier of inorganic coatings 14 and an organic coating 16, as in FIG. 1, on an organic film substrate 12 which is a flexible plastic film substrate.

Structure 600 forms a top barrier system including a multi-layer barrier of inorganic coatings 24 an organic coatings 26, which are different from coatings 14 and 16 respectively, on a flexible plastic substrate 22, and an adhesion providing layer 402, for example of curable adhesive resin, bonding structure 600 to device 70; the arrow shows diffusion direction.

EXAMPLES

The present invention will be more readily understood by referring to the following examples, which are given to illustrate the invention rather than to limit its scope.

Example I

This example describes preparation of a high-barrier material, which comprises a multilayer structure of inorganic (plasma-deposited silica, referred to as $SiO_2$ in the examples) and organic (plasma-polymerized hexamethyldisiloxane PP-HMDSO) layers, deposited sequentially on a surface of polyethylene terephthalate (PET) film.

A letter-size sample of a PET film was placed on an RF-powered electrode in a vacuum plasma chamber and evacuated to a base pressure of about $10^{-3}$ Torr. The first layer, namely $SiO_2$, was deposited using the plasma enhanced chemical vapor deposition method (PECVD), from hexamethyldisiloxane (HMDSO) in the presence of oxygen at high concentration. Deposition was performed using the following plasma parameters:

RF power P=80 W; Total pressure p=80 mTorr; Deposition time t=40 s; Volume ratio of gas mixture components, expressed as respective flowrates, was: HMDSO—10 sccm, $O_2$—90 sccm, and Ar—15 sccm. The second layer, namely plasma-polymerized hexamethyldisloxane (PP-HMDSO), was deposited using PECVD method from hexamethyldisiloxane (HMDSO) in the presence of the inert gas. Deposition was performed using the following plasma parameters:
RF power P=65 W; Total pressure p=80 mTorr; Deposition time t=20 s; Volume ratio of gas mixture components, expressed as respective flowrates, was: HMDSO—10 sccm, and Ar—15 sccm.

The procedures of depositing and (PP-HMDSO) were then repeated to obtain the final structure of a 5-layer high barrier material as follows: $PET/SiO_2/PP$ $HMDSO/SiO_2/PP$ $HMDSO/SiO_2$, where the thicknesses of successive layers are given in Table 1.

TABLE 1

Thickness measurement carried out on a reference silicon wafer using variable angle spectroscopic ellipsometry (J. A. Woollam Company, Inc.)

| | |
|---|---|
| $SiO_2$ | 47 nm |
| PP HMDSO | 25 nm |
| $SiO_2$ | 45 nm |
| PP HMDSO | 22 nm |
| $SiO_2$ | 44 nm |
| Silicon | 1 mm |

Oxygen Transmission Rate, OTR, (at 30° C., 0% RH, 100% $O_2$) below the sensitivity limit of the Mocon "Oxtran 2/20MB" instrument (0.1 $cm^3/m^2$ day) was achieved.

Example II

This example describes preparation of a high-barrier material, which comprises a multilayer structure of inorganic (plasma-deposited silica) and organic (plasma-polymerized hexamethyldisiloxane PP-HMDSO) layers, deposited sequentially on a surface of polyethyleneterephthalate (PET) film.

A letter-size sample of a PET film was placed on an RF-powered electrode in a vacuum plasma chamber and evacuated to a base pressure of about $10^{-3}$ Torr. The first layer, namely SiOx, was deposited using the plasma enhanced chemical vapor deposition method (PECVD), from hexamethyldisiloxane (HMDSO) in the presence of oxygen at high concentration. Deposition was performed using the following plasma parameters:

RF power P=180 W; Total pressure p=80 mTorr; Deposition time t=120 s; Volume ratio of gas mixture components, expressed as respective flowrates, was: HMDSO—10 sccm, $O_2$—90 sccm, and Ar—15 sccm. The second layer, namely plasma-polymerized hexamethyldisiloxane (PP-HMDSO)

was deposited using PECVD method from hexamethyldisiloxane (HMDSO) in the presence of the inert gas. Deposition was performed using the following plasma parameters: RF power P=65 W; Total pressure p=80 mTorr; Deposition time t=50 s; Volume ratio of gas mixture components, expressed as respective flowrates, was: HMDSO—10 sccm, and Ar—15 sccm.

The procedures of depositing silicon dioxide and (PP-HMDSO) were then repeated to obtain the final structure of a 5-layer high barrier material as follow: PET/SiO$_2$/PP HMDSO/SiO$_2$/PP HMDSO/SiO$_2$, where the thicknesses of successive layers are given in Table II.

TABLE 1

Thickness measurement carried out on a reference silicon wafer using variable angle spectroscopic ellipsometry (J. A. Woollam Company Inc.)

| | |
|---|---|
| SiO$_2$ | 148 nm |
| PP HMDSO | 55 nm |
| SiO$_2$ | 150 nm |
| PP HMDSO | 52 nm |
| SiO$_2$ | 153 nm |
| Silicon | 1 mm |

Oxygen Transmission Rate, OTR, (at 30° C., 0% RH, 100% O$_2$) below the sensitivity limit of the Mocon "OXTRAN 2/20L" instrument. (0.005 cm$^3$/m$^2$ day) was achieved, and Water Vapor Transmission rate, WVTR, (at 38° C., 100% RH) below the sensitivity limit of the Mocon "PERMATRAN W-3/31" instrument (0.005 g/m$^2$ day) was achieved.

Example III

This example describes preparation of a high barrier material, which contains a multilayer structure of inorganic (plasma-deposited silica) and organic (plasma polymerized hexamethyldisiloxane PP-HMDSO) layers, deposited sequentially on a surface of hard coated polycycloolefine film substrate.

The surface of a letter-size sample of a polycycloolefin film, covered with a commercial hard coating (about 5 μm thick) was placed on an RF-powered electrode in a vacuum plasma chamber and evacuated to a base pressure of about 10$^{-3}$ Torr. The first layer, namely SiO$_2$, was deposited using the plasma-enhanced chemical vapor deposition method (PECVD), from hexamethyldisiloxane (HMDSO) in the presence of oxygen at high concentration. Deposition of silica and subsequent deposition of PP-HMDSO was performed using PECVD method with the same parameters as in Example I. The procedures of depositing silica and (PP-HMDSO) were then repeated to obtain the final structure of a 5-layer high barrier material as follows: Substrate/SiO$_2$/PP-HMDSO/SiO$_2$/PP-HMDSO/SiO$_2$, where the thicknesses of successive layers were similar to those given in the Example I.

Oxygen Transmission Rate, OTR (at 23° C., 0% RH, 100% O$_2$), below the sensitivity limit of the Mocon "Oxtran 2/20L" instrument (0.005 cm$^3$/m$^2$ day) was achieved.

Example IV

Two types of samples were prepared, namely:
a) PET/SiO$_2$/PP-HMDSO, and,
b) PET/PP-HMDSO/SiO$_2$, using coating parameters similar to those given in Examples I and II above.

Oxygen Transmission Rate (OTR) measured using the Mocon 2/20 MB instrument (at 30° C., 0% RH, 100% O$_2$) was about 3 cm$^3$/m$^2$ day for samples of type b, but was found to be near the sensitivity limit of the instrument for samples of type a (that is, 0.1 cm$^3$/m$^2$ day). This clearly shows that the bi-layer structure containing the SiO$_2$ coating directly in contact with the PET substrate provides lower OTR values than the structure in which the SiO$_2$ coating is deposited on an intermediate plasma-polymer (PP HMDSO) layer.

The invention claimed is:

1. An organic light emitting or photovoltaic device in which organic semi-conductors are encased in a barrier envelope, said envelope comprising a multilayer structure comprising:
   i) an organic self-supporting substrate layer having a thickness of 50 μm to 5,000 μm, and
   ii) a multilayer permeation barrier thereon, said barrier comprising:
      a) a first inorganic coating contacting a surface of said substrate layer, said inorganic coating being impermeable to gases, when formed as a continuous coating but exhibiting discontinuity-controlled permeability through inadvertent discontinuities in the inorganic coating, said first inorganic coating having a thickness of 45 nm to 350 nm, and
      b) a first organic coating contacting a surface of said first inorganic coating, said organic coating exhibiting diffusion controlled permeation of water vapor and oxygen.

2. A device according to claim 1 wherein said coatings a) and b) form a first permeation barrier of said mutilayer permeation barrier, and said multilayer permeation barrier further comprises at least one inorganic coating and at least one organic coating, in alternating relationship with said coatings of said first permeation barrier.

3. A device according to claim 1 wherein said coatings a) and b) form a first permeation barrier of said mutilayer permeation barrier, and said multilayer permeation barrier further comprises a first plurality of inorganic coatings and a second plurality of organic coatings, in alternating relationship, with an inorganic coating of said first plurality contacting coating b).

4. A device according to claim 1 wherein said organic coating has a thickness of 5 nm to 10 μm.

5. A device according to claim 1 wherein said organic coating has a thickness of 20 to 500 nm.

6. A device according to claim 2, wherein each inorganic coating has a thickness of 45 to 350 nm.

7. A device according to claim 3, wherein each organic coating has a thickness of 20 to 500 nm.

8. A multilayer structure according to claim 2, wherein each organic coating has a thickness of 20 to 500 nm, and at least one organic coating of said second permeation barrier has a thickness greater than 1 μm up to 10 μm.

9. A device according to claim 1, wherein said organic substrate has a thickness of 50 to 300 μm.

10. A device according to claim 9, wherein the substrate is selected from the group consisting of:
   a) single, multi-layer or coextruded plastic films;
   b) plastic films having the surface modified by at least one of the following techniques: corona discharge treatment, low or atmospheric pressure glow discharge, flame treatment and heat treatment, and a radiation treatment wherein the radiation is selected from the group consisting of UV, VUV, X-rays, gamma-rays, and particle radiation;

c) plastic films having a surface coated with a functional coating selected from a hard-coating, an anti-scratch coating, an anti-abrasion coating, an anti-reflective coating, an anti-glare coating, a chemically-active coating, an oxygen scavenger coating, a desiccant coating, a UV-protective coating, and a colour-adjustment coating.

11. A device according to claim 10 wherein the or each inorganic coating is completely or essentially made of an inorganic material which is selected from the group consisting of $SiO_2$, $SiO_x$, $SiO_xC_y$, $Si_3N_4$, $Si_xN_yC_z$, $SiO_xN_y$, $TiO_2$, $TiO_x$, $ZrO_2$, $ZrO_x$, $Al_2O_3$, $SnO_2$, $In_2O_3$, ITO, PbO, $PbO_2$, $B_2O_3$, $P_2O_5$, tantalum oxide, yttrium oxide, barium oxide, magnesium oxide, amorphous carbon, sulphur, selenium, magnesium fluoride, calcium fluoride, calcium oxide, mixtures thereof, or their alloys or compounds; wherein x represents an integer ranging from 1 to 3, y represents a number ranging from 0.01 to 5 and z represents a number ranging from 0.01 to 5.

12. A device according to claim 11, wherein the or each organic coating is completely or essentially made of an organic material which is selected from the group consisting of plasma-deposited coatings obtained from mixtures containing at least one organic substance, gas or vapor at normal pressure, with or without contribution of inert or reactive gases, said organic substance being selected from: hydrocarbons, organic compounds containing one or more heteroatoms, alcohols, ethers, esters, or their combinations, organosilicon compounds, and organometallic compounds.

13. A device according to claim 1, wherein the substrate is rigid.

14. A device according to claim 1, wherein the substrate is flexible.

15. A device according to claim 1, wherein the multilayer structure is transparent.

16. A device according to claim 1, having an oxygen permeation, measured by ASTM methods F1927 and D3985 which is lower than 2 $cm^3/m^2$ day.

17. A device according to claim 1, having an oxygen permeation, measured by ASTM methods F1927 and D3985 which is lower than 0.01 $cm^3/m^2$ day.

18. A device according to claim 1, wherein said multilayer barrier has hardness of less than 2 GPa.

19. A device according to claim 1, wherein said substrate has a smooth, flat surface in direct contact with said first inorganic coating.

20. An organic light emitting device in which light emitting diodes are encased in said barrier envelope, as defined in claim 1.

21. A process for producing an organic light emitting or photovoltaic device comprising preparing a multilayer permeation barrier structure by:

i) depositing an inorganic material on an organic self-supporting substrate to form an inorganic coating in contact with a surface of said organic substrate, said substrate having a thickness of 50 µm to 5,000 µm, said formed inorganic coating having a thickness of 45 nm to 350 nm, said formed inorganic coating having inadvertent discontinuities such that said inorganic coating exhibits discontinuity-controlled permeability;

ii) depositing an organic coating on said inorganic coating, said organic coating exhibiting diffusion controlled permeation of water vapor and oxygen, and iii) enveloping an organic semi-conductor for said device in an envelope which comprises said barrier structure.

22. A process according to claim 21, wherein said depositing in i) is by PECVD, CVD, PVD, evaporation, reactive evaporation, sputtering, reactive sputtering, cathodic or anodic arc evaporation or wet chemical, in partial vacuum, or at or above atmospheric pressure; and said depositing in ii) is in partial vacuum, or at or above atmospheric pressure, using dip coating, spray coating, cast coating, sputtering, reactive sputtering, evaporation, reactive evaporation, PECVD, pyrolysis/condensation or pyrolysis/polymerization methods.

23. A process according to claim 21, wherein the depositing of inorganic material is carried out by using PECVD or PVD, in partial vacuum; and the depositing of organic material is carried out using PECVD or pyrolysis/polymerisation method in partial vacuum.

* * * * *

UNITED STATES PATENT AND TRADEMARK OFFICE
CERTIFICATE OF CORRECTION

PATENT NO. : 7,074,501 B2
APPLICATION NO. : 10/487181
DATED : July 11, 2006
INVENTOR(S) : Grzegorz Czeremuszkin et al.

It is certified that error appears in the above-identified patent and that said Letters Patent is hereby corrected as shown below:

Column 16, claim 2, line 34, "mutilayer" should read --multilayer--.

Column 16, claim 3, line 41, "mutilayer" should read --multilayer--.

Signed and Sealed this

Sixth Day of February, 2007

JON W. DUDAS
*Director of the United States Patent and Trademark Office*